(12) United States Patent
Li (10) Patent No.: US 11,469,258 B2
(45) Date of Patent: Oct. 11, 2022

(54) DISPLAY PANEL AND DISPLAY DEVICE (71) Applicant: BOE TECHNOLOGY GROUP CO., LTD., Beijing (CN)

(72) Inventor: Wusheng Li, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/337,687

(22) Filed: Jun. 3, 2021

(65) Prior Publication Data

US 2021/0288081 A1 Sep. 16, 2021

Related U.S. Application Data (63) Continuation-in-part of application No. 16/322,420, filed as application No. PCT/CN2018/086843 on May 15, 2018, now abandoned.

(30) Foreign Application Priority Data

May 31, 2017 (CN) .......................... 201710401601.7

(51) Int. Cl.
*H01L 27/12* (2006.01)
(52) U.S. Cl.
CPC ................................ *H01L 27/1244* (2013.01)
(58) Field of Classification Search
CPC ............. G02F 1/136286; H01L 27/124; H01L 27/1244
See application file for complete search history.

(56) References Cited

U.S. PATENT DOCUMENTS 5,652,633 A 7/1997 Lee
7,995,157 B2 8/2011 Song et al.
(Continued)

FOREIGN PATENT DOCUMENTS

CN 101075048 A 11/2007
CN 101882596 A 11/2010
(Continued)

OTHER PUBLICATIONS

First Office Action for CN Patent Application No. 201710401601.7 dated Sep. 4, 2018.
(Continued)

*Primary Examiner* — Angela K Davison
(74) *Attorney, Agent, or Firm* — Xsensus LLP (57) ABSTRACT

A display panel and a display device are provided that relate to the field of display technology. The display panel includes a first signal line having a first and a second sub-portions; at least one insulating layer disposed on the first signal line; and a second signal line having a third and a fourth sub-portions disposed on the insulating layer. The second sub-portion and the fourth sub-portion have an overlapping part therebetween, the first sub-portion and the third sub-portion do not overlap each other, the second sub-portion has a varying line width, and at least one edge of the second sub-portion is extended away from a straight line connecting two vertices of the edge so that a distance D between and the straight line and a first point of the edge extending farthest from the straight line is in the range of 0.05 μm to 0.8 μm.

20 Claims, 5 Drawing Sheets

(56) References Cited

U.S. PATENT DOCUMENTS

| | | | |
|---|---|---|---|
| 2007/0268422 A1* | 11/2007 | Song | H01L 27/124 349/43 |
| 2010/0065841 A1 | 3/2010 | Lee et al. | |
| 2015/0214376 A1 | 7/2015 | Koezuka et al. | |
| 2016/0099327 A1 | 4/2016 | Kwak | |
| 2018/0182782 A1* | 6/2018 | Zhou | H01L 27/124 |

FOREIGN PATENT DOCUMENTS

| | | |
|---|---|---|
| CN | 203025453 U | 6/2013 |
| CN | 203882052 U | 10/2014 |
| CN | 104460150 A | 3/2015 |
| CN | 105182646 A | 12/2015 |
| CN | 106469655 A | 3/2017 |
| CN | 107230661 A | 10/2017 |
| GB | 2438238 A | 11/2007 |
| GB | 2438238 B | 7/2009 |
| KR | 970059791 A | 8/1997 |
| KR | 100192373 B1 | 6/1999 |
| WO | 2016090659 A1 | 6/2016 |

OTHER PUBLICATIONS

Second Office Action for CN Patent Application No. 201710401601.7 dated Mar. 27, 2019.

Third Office Action for CN Patent Application No. 201710401601.7 dated Aug. 30, 2019.

Fourth Office Action for CN Patent Application No. 201710401601.7 dated Jan. 16, 2020.

International Search Report and Written Opinion for International Application No. PCT/CN2018/086843 dated Aug. 15, 2018.

Non-Final Office Action for U.S. Appl. No. 16/322,420 dated Jan. 24, 2020.

Final Office Action for U.S. Appl. No. 16/322,420 dated Jun. 29, 2020.

Non-Final Office Action for U.S. Appl. No. 16/322,420 dated Nov. 2, 2020.

Final Office Action for U.S. Appl. No. 16/322,420 dated Feb. 5, 2021.

* cited by examiner

DISPLAY PANEL AND DISPLAY DEVICE

CROSS-REFERENCE TO RELATED APPLICATIONS

The present application is continuation-in-part of U.S. patent application Ser. No. 16/322,420, filed Jan. 31, 2019, which is a national phase application of International Application No. PCT/CN2018/086843, filed on May 15, 2018, which is based upon and claims priority to Chinese Patent Application No. 201710401601.7, filed on May 31, 2017, where the contents thereof are incorporated by reference in their entireties herein.

TECHNICAL FIELD

The present disclosure relates to the technical field of display technology and, in particular, to a display panel and a display device.

BACKGROUND

To manufacture an array substrate of a display panel, copper is generally used as a material of a source/drain metal layer including a source electrode, a drain electrode, and a data line in the array substrate. Since the property of copper is relatively active, and copper is prone to diffuse into other films or layers, and under the action of high temperature or an applied electric field, copper is prone to be oxidized, it may affect the display effect of the display device including the array substrate. Therefore, the material constituting the source/drain metal layer generally further includes molybdenum-niobium (chemical formula: MoNb), and a molybdenum-niobium layer is usually formed on the upper and lower surfaces of the copper metal layer to protect the copper.

It should be noted that the information disclosed in the background section above is only for enhancing the understanding of the background of the present disclosure, and thus may include information that does not constitute prior art known to those of ordinary skill in the art.

SUMMARY

Arrangements of the present disclosure provide a display panel and a display device.

In one aspect of the arrangements of the present disclosure, there is provided a display panel, including: a first signal line having a first sub-portion and a second sub-portion; at least one insulating layer disposed on the first signal line; a second signal line having a third sub-portion and a fourth sub-portion and disposed on the insulating layer, wherein the second sub-portion and the fourth sub-portion have an overlapping part therebetween, the first sub-portion and the third sub-portion do not overlap each other, the second sub-portion has a varying line width, and at least one edge of the second sub-portion is extended away from a straight line connecting two vertices of the edge, so that a distance D between and the straight line and a first point of the edge extending farthest from the straight line is in the range of 0.05 μm to 0.8 μm.

In some arrangements, the overlapping part between the second sub-portion and the fourth sub-portion is an overlap area of orthographic projections of the first signal line 111 and the second signal line on the substrate.

In some arrangements, the second sub-portion is extended in the form of an arc line or a polygonal line.

In some arrangements, a width of the second sub-portion at the first point of the edge extending farthest from the straight line is greater than or less than an average width of the second sub-portion.

In some arrangements, a width of the second sub-portion is substantially uniform.

In some arrangements, a maximum width or a minimum width of the second sub-portion is not equal to a width of the first sub-portion, and a difference $\Delta d1$ between the maximum width or minimum width of the second sub-portion and the width of the first sub-portion satisfies: $0\ \mu m < |\Delta d1| \leq 3.5\ \mu m$.

In some arrangements, a width of the third sub-portion is not equal to a width of the fourth sub-portion, and a difference $\Delta d2$ between the width of the third sub-portion and the width of the fourth sub-portion satisfies: $0\ \mu m < |\Delta d1| \leq 1.5\ \mu m$.

In some arrangements, the second signal line comprises a metal layer and at least one metal protection layer, and wherein the metal protection layer is disposed on a side of the metal layer facing the insulating layer.

In some arrangements, a metal contact angle of the metal protection layer is 43°~85°.

In some arrangements, the first signal line is a gate line or a common line, and the second signal line is a data line; or the first signal line is the data line, and the second signal line is the gate line or the common line.

In one aspect of the arrangements of the present disclosure, there is provided a display device including the display panel according to the aspects of arrangements of the present disclosure.

In one aspect of the arrangements of the present disclosure, there is provided a manufacturing method for an array substrate. The manufacturing method includes forming a first conductive film on a substrate. The manufacturing method includes patterning the first conductive film to form a first conductive layer formed of a conductive pattern. The first conductive layer includes a first signal line. The manufacturing method includes forming a second conductive film on the first conductive layer and patterning the second conductive film to form a second conductive layer formed of a conductive pattern. The second conductive layer includes a second signal line. The first signal line and the second signal line intersect with each other and are insulated from each other. In a portion of an upper surface of the first signal line which overlaps with the second signal line. A length of an edge extending in a direction along with the second signal line is larger than a linear distance between two vertices of the edge.

In some arrangements, a width of the second signal line in an overlapping region of orthogonal projections of the second signal line and the first signal line on the substrate is greater than a width of the second signal line in a non-overlapping region of the orthogonal projections of the second signal line and the first signal line on the substrate.

In some arrangements, the manufacturing method further includes roughening the second conductive film.

In some arrangements, roughening the second conductive film includes coating a surface of the second conductive film with a photoresist, pre-baking, exposing, developing, and post-baking the photoresist, and removing the photoresist.

In another aspect of the arrangements of the present disclosure, there is provided an array substrate. The array substrate includes a substrate, and a first signal line and a second signal line disposed in sequence on the substrate. The first signal line and the second signal line intersect with each other and are insulated from each other. In a portion of an upper surface of the first signal line which overlaps with the second signal line, a length of an edge extending in a direction of the second signal line is greater than a linear distance between two vertices of the edge.

In some arrangements, in the portion of the upper surface of the first signal line which overlaps with the second signal line, two edges along the direction of the second signal line are all arc lines.

In some arrangements, a width of the second signal line in an overlapping region of orthogonal projections of the second signal line and the first signal line on the substrate is greater than a width of the second signal line in a non-overlapping region of the orthogonal projections of the second signal line and the first signal line on the substrate.

In some arrangements, the first signal line is a gate line and/or a common line, and the second signal line is a data line. In some arrangements, the first signal line is a data line, and the second signal line is a gate line and/or a common line.

In some arrangements, the second signal line includes a first copper diffusion barrier layer, a copper/copper alloy layer, and a second copper diffusion barrier layer disposed in sequence.

In still another aspect of the arrangements of the present disclosure, there is provided a display device including any of the array substrate described above.

The arrangements of the present disclosure provide an array substrate, a manufacturing method thereof, and a display device. The manufacturing method for the array substrate includes forming a first conductive film on a substrate, and patterning the first conductive film to form a first conductive layer formed of a conductive pattern. The first conductive layer includes a first signal line. The manufacturing method includes forming a second conductive film on the first conductive layer, and patterning the second conductive film to form a second conductive layer formed of a conductive pattern. The second conductive layer includes a second signal line. The first signal line and the second signal line intersect with each other and are insulated from each other.

In a portion of an upper surface of the first signal line which overlaps with the second signal line, a length of an edge extending in a direction along with the second signal line is greater than a linear distance between two vertices of the edge.

It should be understood that the above general description and the following detailed description are merely exemplary and explanatory, and are not limiting of the present disclosure.

This section provides an overview of various implementations or examples of the techniques described in the present disclosure, and is not a comprehensive disclosure of the full scope or all features of the disclosed technology.

BRIEF DESCRIPTION OF THE DRAWINGS

In order to more clearly illustrate the arrangements of the present disclosure or the technical solutions in the related art, the drawings used in the arrangements or the description of the related art will be briefly described below. Understandably, the drawings in the following description only illustrate some arrangements of the present disclosure, and other drawings can be obtained from these drawings by those skilled in the art without any creative effort.

DETAILED DESCRIPTION

The technical solutions in the arrangements of the present disclosure are clearly and completely described in the following with reference to the accompanying drawings in the arrangements of the present disclosure. Understandably, the described arrangements are only a part of the arrangements of the present disclosure, but not all of the arrangements. All other arrangements obtained by those skilled in the art based on the arrangements of the present disclosure without creative efforts fall within the scope of the present disclosure.

According to an arrangement of the present disclosure, there is provided a method and a mask design to solve the step open problem in oxide back channel (Oxide BCE) lithography and etching processes. Specifically, according to this arrangement, in order to reduce the number of masks used in the oxide TFT production process, the SDT (Surface Deposition Technology) process is introduced into the oxide TFT production. The metal material of the SD layer included in the TFT is three layers of MoNb/Cu/MoNb, and this selection can prevent Cu oxidation in the subsequent process. However, in this arrangement, after the SD layer metal material is determined, a new problem is encountered, that is, due to the low adhesion of the photoresist on the MoNb surface, photoresist gaps may be generated at the step region where the data line overlaps the gate line, which will lead to disconnection due to erosion during the subsequent Cu etching.

Figure 1:
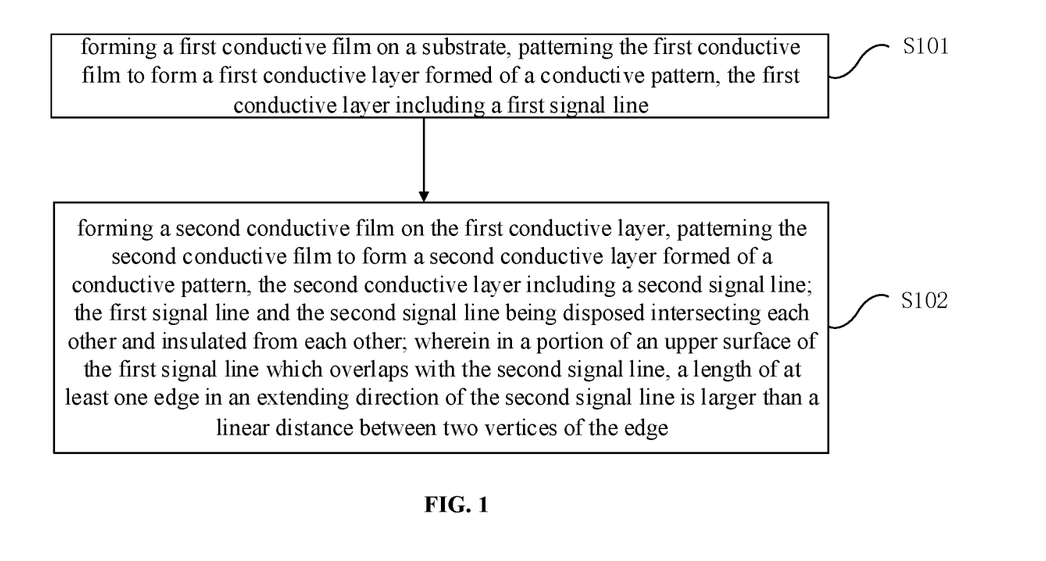
FIG. 1 is a flowchart of a method for manufacturing an array substrate according to an arrangement of the present disclosure.

An arrangement of the present disclosure provides a method for manufacturing an array substrate. As shown in FIG. 1, the method includes the following blocks.

Figure 2:
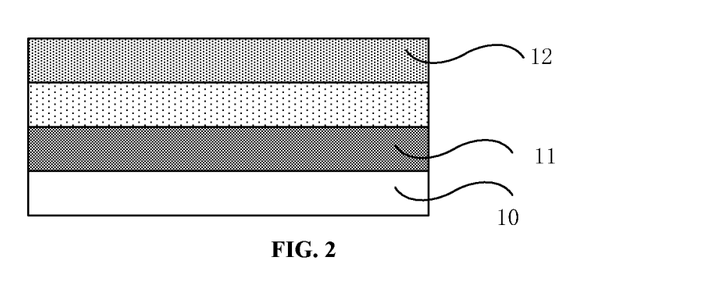
FIG. 2 is a schematic structural diagram of an array substrate manufactured according to the manufacturing method shown in FIG. 1.
Figure 3:
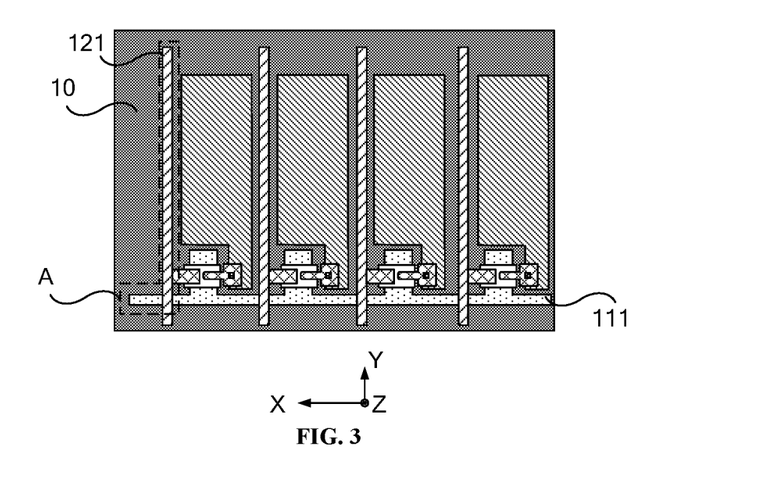
FIG. 3 is a schematic structural diagram of an array substrate according to an arrangement of the present disclosure.

In block S101, a first conductive film is formed on the substrate 10, and the first conductive film is patterned to form a first conductive layer 11 formed of a conductive pattern, as shown in FIG. 2. Referring to FIG. 3, the first conductive layer 11 includes a first signal line 111.

It should be noted that the patterning may refer to a process including a photolithography process, or including a photolithography process and an etching operation to form a predetermined pattern. The photolithography process includes a process of forming a film, exposing, developing, etc., and specifically, a process of forming a pattern by using a photoresist, a mask, an exposure machine, or the like.

In block S102, a second conductive film is formed on the first conductive layer 11, and the second conductive film is patterned to form a second conductive layer 12 formed of a conductive pattern, as shown in FIG. 2. Referring again to FIG. 3, the second conductive layer 12 includes a second signal line 121, and the first signal line 111 and the second signal line 121 are disposed as intersecting with each other and being insulated from each other.

Figure 4A:
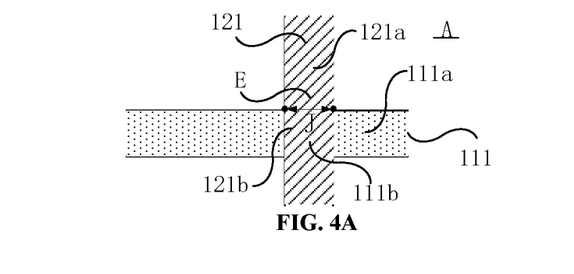
FIG. 4A is an enlarged view of an area A in the array substrate shown in FIG. 3.

As shown in FIG. 4A, in the portion of the upper surface of the first signal line 111 which overlaps with the second signal line 121, a length of at least one edge E in the extending direction of the second signal line 121 is larger than a linear distance J between the two vertices of the edge. The extending direction of the second signal line 121 is the Y direction in FIG. 3. That is, the edge E being an edge positioned in the Y direction with respect to other edges of the overlapped portion. In other words, an overlapping pattern, or an overlapping region, OP is formed by orthogonal projections of the second signal line 121 and the first signal line 111 on the substrate, a length of at least one edge of the overlapping pattern OP in an extending direction of the second signal line is larger than a linear distance between two vertices of the edge.

It should be noted that, first, the shape of the mask can be controlled to have a specific pattern the same as the shape of the first signal line 111 desired to be formed, so that after an exposure is performed with the mask and the subsequent photolithography process is performed, the first signal line 111 as formed may have the desired feature.

Second, after the first signal line 111 is formed, an insulating layer may be formed on the surface of the first conductive layer 11 and then, the second conductive layer 12 is formed on the surface of the insulating layer, so that the formed first signal line 111 and the second signal line 121 may be disposed intersecting each other and insulated from each other, and the second signal line 121 is located above the first signal line 111.

Third, patterning the second conductive film to form a second conductive layer 12 formed of a conductive pattern may specifically include: coating a photoresist on the surface of the second conductive film, and forming the second conductive layer 12 through processes of exposing, developing, and etching.

Based on this, the present disclosure provides a method for manufacturing an array substrate. Specifically, a first conductive film is formed on the substrate 10, and the first conductive film is patterned to form a first conductive layer 11 formed of a conductive pattern, the first conductive layer 11 including a first signal line 111. A second conductive film is formed on the first conductive layer 11, and the second conductive film is patterned to form a second conductive layer 12 formed of a conductive pattern, the second conductive layer 12 including a second signal line 121, the first signal line 111 and the second signal line 121 are disposed intersecting each other and insulated from each other.

In the portion of the upper surface of the first signal line 111 which overlaps with the second signal line 121, a length of at least one edge E in the extending direction of the second signal line 121 is larger than a linear distance J between the two vertices of the edge E. Assuming that the thickness of the first signal line 111 is constant, the contact area of the second conductive film with the first conductive layer 11 at the climbing area will be increased, compared to the case where the edge E has a length equal to the linear distance between the two vertices of the edge E. In this way, when photoresist is formed on the surface of the second conductive film, the photoresist can have an increased contact area with the second conductive film at the climbing area, which can reduce the chance of generating voids in the photoresist at the climbing area. In turn, during the etching process, it can reduce the chance of the etching liquid intruding into the second conductive film through the voids and causing the second signal line 121 to be broken.

Further, the present disclosure does not limit the shape of the edge E as long as the length of the edge E is larger than the linear distance J between the two vertices of the edge E. For example, the edge E may be as shown in FIG. 4A, at least one edge E may be an arc line; or the edge E may be a polygonal line.

Figure 5A:
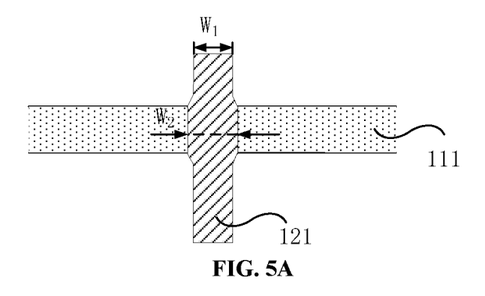
FIG. 5A is a schematic structural diagram of a first signal line and a second signal line in the array substrate shown in FIG. 3.

Taking the edge E as an arc line as an example, when forming the second signal line 121 by the patterning process, in order to increase the contact area of the photoresist with the second conductive film at the climbing area, optionally, in the portion of the upper surface of the first signal line 111 which overlaps with the second signal line 121, two edges E in the extending direction of the second signal line 121 are all arc lines. As shown in FIG. 5A, the arc lines of the two edges E have the same protrusion direction. However, the arc lines of the two edges E may have different protrusion directions. Considering that the thinness of the signal line is generally small, when the arc lines of the two edges E have protrusion directions pointing to each other, the portion of the upper surface of the first signal line 111 which overlaps with the second signal line 121 may have a smaller width, and the first signal line 111 may be easily broken. Therefore, when the first signal line 111 is relatively thin, optionally, in the portion of the upper surface of the first signal line 111 which overlaps with the second signal line 121, the two edges E along the extending direction of the second signal line 121 may be arc lines having the same protrusion direction, or having protrusion directions pointing away from each other.

According to one arrangement, as shown in FIG. 4A, the first signal line 111 includes a first sub-portion 111a and a second sub-portion 111b, and the second signal line 121 includes a third sub-portion 121a and a fourth sub-portion 121b. There is a portion overlapping each other between the portion 111b and the fourth sub portion 121b, and there is no overlap between the first sub portion 111a and the third sub portion 121a. The overlapping part between the second sub-portion 111b and the fourth sub-portion 121b is the overlap area of the orthographic projection of the first signal line 111 and the second signal line 121 on the substrate. It should be understood that although not shown, at least one insulating layer may be formed on the first signal line 111, and the second signal line 121 may be formed on the insulating layer, so that the first signal line 111 and the second signal line 121 are insulated from each other.

According to this arrangement, the second sub-portion 111b of the first signal line 111 may have a varying line width. In this arrangement, at least one edge of the second sub-portion may extend away from the straight line connecting the two vertices of the edge. For example, as shown in FIG. 4A, one edge E of the second sub-portion 111b extends upward, so that the second sub-portion has a varying line width. In this arrangement, the distance D between the highest point of the edge E extending upward and the straight line connecting the two vertices of the edge E is in the range of 0.8% to 12% of a width of the second sub-portion, for example in one implementation, the maximum with of the first signal line 111 hat the overlapped portion is 7.5 μm, and the distance D is about 0.05 to 0.8 μm. In the present disclosure, the term width of the second sub-portion may represent the width of the second sub-portion in the case where the edge E is not extending away from the straight line connecting the two vertices of the edge. In other words, the width of the second sub-portion may represent the distance between the straight line between connecting the two vertices of one edge of the second sub-portion and the straight line between connecting the two vertices of the other edge of the second sub-portion. If the distance D is less than 0.05 μm, the adhesion of the photoresist on the MoNb surface may be insufficient, resulting in photoresist gaps at the step, which may lead to disconnection during the etching process. If the distance D is greater than 0.8 μm, parasitic capacitance may increase, thereby affecting display performance.

Figure 4B:
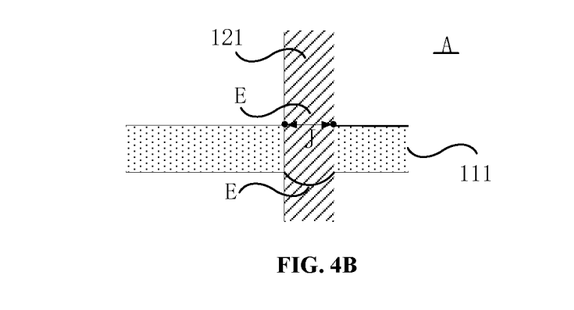
FIG. 4B is a schematic structural diagram of another arrangement of FIG. 4A.
Figure 5B:
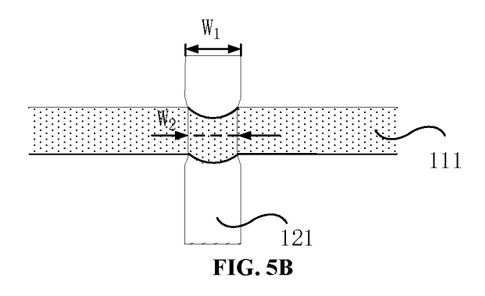
FIG. 5B is a schematic structural diagram of another arrangement of FIG. 5A.
Figure 6:
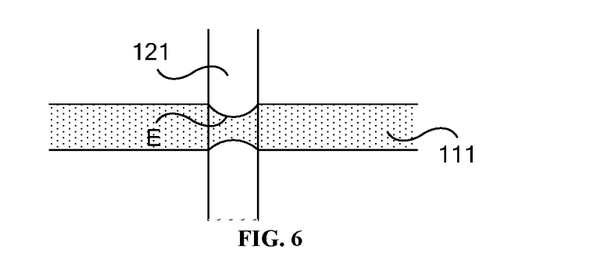
FIG. 6 is another schematic structural diagram of a first signal line and a second signal line in the array substrate shown in FIG. 3.

In this arrangement, one edge E of the second sub-portion 111b extends upward, but it should be understood that the present disclosure is not limited to this. In other arrangements, for example, as shown in FIG. 4B, the two edges of the second sub-portion 111b both extend away from the center of the first signal line 111. In other arrangements, for example, as shown in FIGS. 5 and 6, both edges may extend toward the same direction, or both edges may extend toward the center of the first signal line 111. Therefore, according to an arrangement of the present invention, the line width at the center of the second sub-portion 111b (that is, where the edge E extends farthest) is greater than or less than the average line width of the second sub-portion 111b; or the line width of the second sub-portion 111b is substantially uniform. More specifically, when only one of the two edges of the second sub-portion 111b extends in a direction away from the center of the first signal line 111, the line width at the center of the second sub-portion 111b (that is, where the edge E extends farthest) is greater than the average line width of the second sub-portion 111b, and when only one of the two edges of the second sub-portion 111b extends toward the center of the first signal line 111, the line width at the center of the second sub-portion 111b (i.e. where the edge E extends farthest) is smaller than the average line width of the second sub-portion 111b. Optionally, when both edges of the second sub-portion 111b extend in a direction away from the center of the first signal line 111, the line width at the center of the second sub-portion 111b (that is, where the edge E extends farthest) is greater than that of the first signal line 111. When both edges of the second sub-portion 111b extend toward the center of the first signal line 111, the line width at the center of the second sub-portion 111b (that is, where the edge E extends farthest) is smaller than the average line width of the second sub-portion 111b. When one of the two edges of the second sub-portion 111b extends toward the center of the first signal line 111 while the other edge is extending in the direction away from the center of the first signal line 111, the width of the second sub-portion 111b is substantially uniform.

Figure 7:
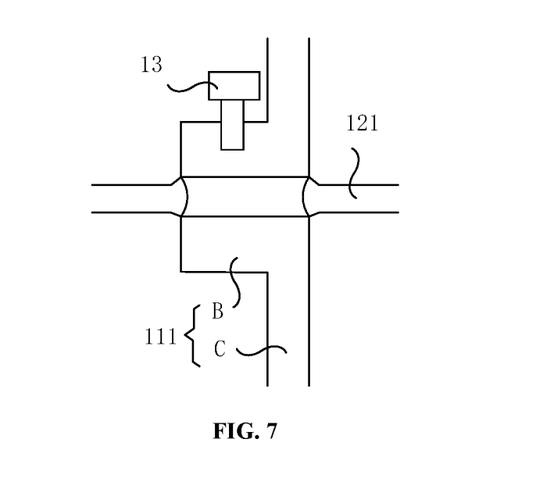
FIG. 7 is another schematic structural diagram of a first signal line and a second signal line in the array substrate shown in FIG. 3.

In order to simplify the process when fabricating the array substrate, sometimes a portion of the gate line serves as the gate electrode. For example, as shown in FIG. 7, the first signal line 111 is a gate line, and the second signal line 121 is a data line. The first signal line 111 includes a convex portion B and a gate line body C. The second signal line 121 overlaps with the convex portion B, and the drain electrode 13 overlaps with the convex portion B. In this case, since the first signal line 111 is relatively thick, even if in the portion of the upper surface of the first signal line 111 which overlaps with the second signal line 121, the two edges E along the extending direction of the second signal line 121 are arc lines having protrusion directions pointing to each other, the portion of the upper surface of the first signal line 111 which overlaps with the second signal line 121 may still have a relatively large width, and thus the chance of broken line can be reduced. The arrangement shown in FIG. 7 may have the similar structure as the arrangement described above with reference FIGS. 4A, 4B, 5A, 5B, and 6, which will not be repeated here.

Since the second sub-portion 111b may have a varying line width and the first sub-portion generally has a uniform line width, the width (for example, the maximum/minimum width) of the second sub-portion 111b of the first signal line 111 may be different from that of the first sub-portions 111a of the first signal line 111. According to an arrangement of the present disclosure, the width difference between the maximum width (or minimum width) of the second sub-portion 111b and the width of the first sub-portion 111a is Δd1, and 0 μm<Δd1≤3.5 μm. For example, in the arrangements of FIGS. 4-6, the second sub-portion 111b is located in the non-TFT area, and its difference Δd1 is a value close to 0 μm, while in the arrangement of FIG. 7, the second sub-portion 111b is located in the TFT area, and the width difference Δd1 is a value close to 3.5 μm.

On this basis, in order to further increase the contact area of the photoresist with the second conductive film at the climbing area, optionally, as shown in FIG. 5A, a width $W_2$ of the second signal line 121 in an overlapping region of orthogonal projections of the second signal line 121 and the first signal line 111 on the substrate 10 is larger than a width $W_1$ of the second signal line 121 in a non-overlapping region of the orthogonal projections of the second signal line 121 and the first signal line 111 on the substrate 10. The width of the second signal line 121 refers to a linear distance from one side of the second signal line 121 to the other side of the second signal line 121 along the extending direction of the first signal line 111 (i.e. the X direction shown in FIG. 3).

According to an arrangement of the present disclosure, the width of the third sub-portion 121a of the second signal line 121 (for example, W1 shown in FIG. 5A) is not equal to the width of the fourth sub-portion 121b (for example, W2 shown in FIG. 5A), the difference between them is Δd2, and 0 μm<|Δd2|≤1.5 μm.

It should be understood that the arrangement of FIG. 5A shows that the width of the third sub-portion 121a is greater than the width of the fourth sub-portion 121b, but the present disclosure is not limited thereto. In other arrangements, for example, as shown in FIG. 5B, the width of the third sub-portion 121a may also be smaller than the width of the fourth sub-portion 121b.

It should be noted that, firstly, the shape of the mask can be controlled to have a specific pattern the same as the shape of the second signal line 121 desired to be formed, so that after exposure is performed with the mask and the subsequent photolithography process is performed, the formed second signal line 121 may have the desired feature.

In this case, when a photoresist is formed on the surface of the second conductive film, at the climbing area, compared to the case where $W_1=W_2$ in the second signal line 121, the photoresist and the upper surface of the second conductive film can have a further increased contact area, so that the chance of generation of voids in the photoresist at the climbing area can be further reduced.

On this basis, the present disclosure does not limit the type of the array substrate. For the signal lines that are arranged intersecting each other in the array substrate, at the overlapping area of the two signal lines, when the signal line at the bottom layer is configured in the above described structure, it can reduce the chance of breaking for the signal line at the top player during fabrication of the signal line. For example, when the array substrate is of a bottom gate type, as shown in FIG. 3, the first signal line 111 may be a gate line or a common line (Gate Common) in the same layer as the gate line, and the second signal line 121 is a data line (SD Line). When the array substrate is of the top gate type, the first signal line 111 is a data line, and the second signal line 121 is a gate line or a common line in the same layer as the gate line.

Further, the first signal line 111 and the second signal line 121 described above are usually formed of copper/copper alloy. Since the property of copper is relatively active, in order to prevent the copper/copper alloy from being oxidized or diffused into the active layer or other films and layers and causing contamination to other films and layers, optionally, a second copper diffusion barrier layer is formed on the upper surface of the copper/copper alloy layer, and a first copper diffusion barrier layer is formed on the lower surface of the copper/copper alloy layer. The first copper diffusion barrier layer and the second copper diffusion barrier layer can prevent copper from diffusing into other films and layers, such as the active layer, and can also prevent the copper/copper alloy from being oxidized in the subsequent fabrication process of other films and layers.

Optionally, the material constituting the copper diffusion barrier layers includes a molybdenum-niobium alloy, a molybdenum-titanium alloy, an indium tin oxide (ITO) and an indium zinc oxide (IZO). The molybdenum-niobium alloy, the molybdenum-titanium alloy, the indium tin oxide, and the indium zinc oxide can prevent the copper/copper alloy from diffusing and thus reduce the chance of being oxidized.

On the basis of this, since the adhesion of the photoresist on the surface of the copper diffusion barrier layer formed of the molybdenum-niobium alloy is low, when the second signal line 121 is formed, increasing the chance of generating a void at the climbing area and causing the formed second signal line 121 to be broken.

In this case, according to the manufacturing method provided by the arrangement of the present disclosure, in the portion of the upper surface of the first signal line 111 which overlaps with the second signal line 121, a length of at least one edge E in the extending direction of the second signal line 121 is larger than a linear distance J between the two vertices of the edge, in order to increase the contact area of the second conductive film with the first conductive layer 11 at the climbing area, and thereby to effectively reduce the chance of generating a void in photoresist at the climbing area when the photoresist is formed on the surface of the second conductive film.

In an arrangement of the present invention, the second signal line 121 may include a metal layer and at least one metal protection layer, wherein the metal protection layer is located on a side of the metal layer facing the insulating layer. According to a specific arrangement, the metal layer may be formed of Cu, the metal protection layer may be formed of MoNb, and the MoNb layer is located on the side of the Cu layer facing the insulating layer.

According to an arrangement of the present disclosure, the metal contact angle of the metal protection layer is 43°~85°. According to this arrangement, the contact angle represents the angle from the solid-liquid interface to the gas-liquid interface through the inside of the liquid at the junction of the solid, liquid, and gas phases. In the present disclosure, the contact angle specifically refers to the contact angle of water droplets, which represents the contact angle of liquid water droplets on the surface of a solid material, and is an important parameter for measuring the wettability of the surface of the material. In other words, according to the arrangement of the present disclosure, when the water droplet is placed on the surface of the metal protective layer, its contact angle is 43°~85°.

In the following, manufacturing process of the array substrate will be described, taking a case where the array substrate is of a bottom gate type, the first signal line 111 is a gate line and the second signal line 121 is a data line as an example. The specific process includes the following operations.

In a first operation, a first conductive film, i.e. a gate film, is formed on the substrate 10, and a layer of photoresist is formed over the first conductive film 101.

In a second operation, the photoresist is exposed with a mask, and after the development, a photoresist retained portion and a photoresist removed portion are formed.

A length of at least one side of the opaque portion of the mask at a predetermined overlapping area of the gate film and the second signal line 121 along the extending direction of the second signal line 121 is larger than a linear distance between the two vertices of the side.

In this way, in a portion of the formed photoresist retained portion corresponding to the portion of the upper surface of the first signal line 111 which overlaps with the second signal line 121, a length of at least one edge in the extending direction of the second signal line 121 is larger than a linear distance between the two vertices of the edge.

In a third operation, the gate film is etched through an etching process to form the first conductive layer 11.

Specifically, the first conductive layer 11 includes a first signal line 111. The first signal line 111 is as shown in FIG. 4A, and in the portion of the upper surface of the first signal line 111 which overlaps with the second signal line 121, a length of at least one edge E in the extending direction of the second signal line 121 is larger than a linear distance J between the two vertices of the edge E.

Then, after the substrate 10 on which the first conductive layer 11 has been formed is cleaned, a gate insulating layer 20 may be deposited on the substrate 10 on which the first conductive layer 11 has been formed by PECVD.

In a fourth operation, an active layer 21 and a second conductive layer 12 are formed on the substrate 10 on which the first conductive layer 11 has been formed.

Specifically, the process includes the following operations.

Figure 8A:
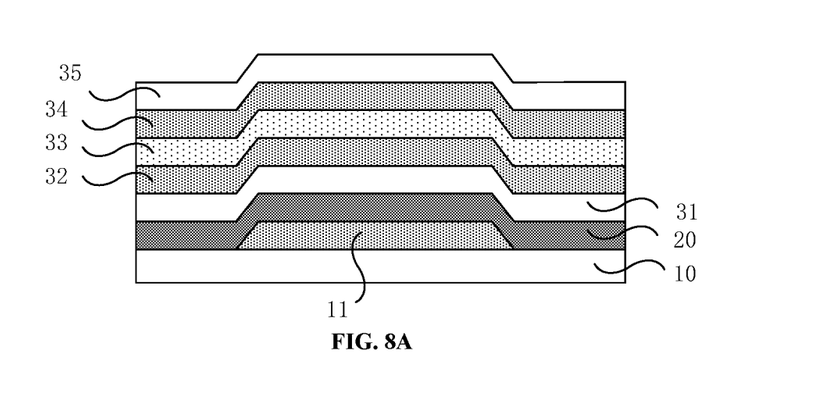
FIGS. 8A-8F are schematic diagrams showing a process of manufacturing an array substrate according to an arrangement of the present disclosure.

In a first operation, as shown in FIG. 8A, an oxide semiconductor film 31, a second conductive film including a first copper diffusion barrier film layer 32, a copper/copper alloy film layer 33 and a second copper diffusion barrier film layer 34 are sequentially formed on the substrate 10 on which the first conductive layer 11 has been formed, and a photoresist 35 is formed over the second conductive film.

Figure 8B:
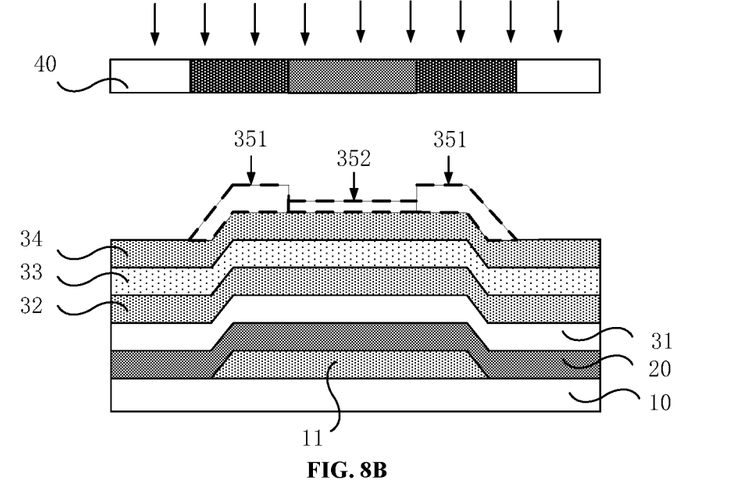

In a second operation, as shown in FIG. 8B, the photoresist 35 is exposed with a halftone mask 40, and after the development, a photoresist completely-retained portion 351, a photoresist half-retained portion 352, and a photoresist completely-removed portion are formed. The photoresist completely-retained portion 351 corresponds to a source and drain electrodes 13, the photoresist half-retained portion 352 corresponds to a region between the source and drain electrodes 13, and the photoresist completely-removed portion corresponds to the other regions.

The halftone mask includes an opaque portion, a translucent portion, and a transparent portion. After the photoresist 35 is exposed, the photoresist completely-retained portion 351 corresponds to the opaque portion of the halftone mask, the photoresist half-retained portion 352 corresponds to the translucent portion of the halftone mask, and the photoresist completely-removed portion corresponds to the transparent portion of the halftone mask.

However, in the above example, the photoresist 35 is a positive glue. When the photoresist 35 is a negative glue, the photoresist completely-retained portion 351 corresponds to the transparent portion of the halftone mask, the photoresist completely-removed portion corresponds to the opaque portion of the halftone mask, and the photoresist half-retained portion 352 also corresponds to the translucent portion of the halftone mask.

Figure 8C:
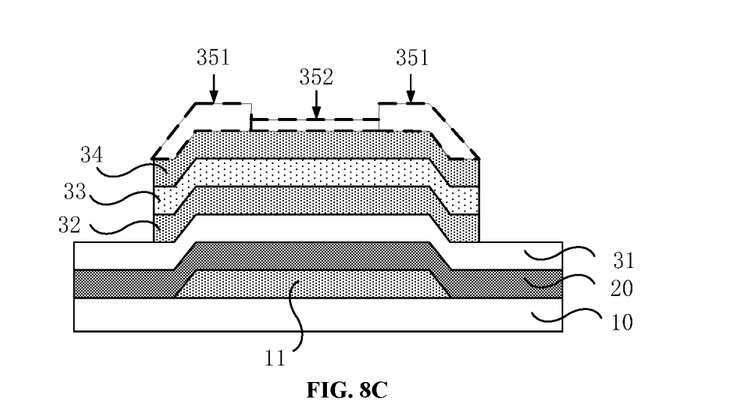

In a third operation, as shown in FIG. 8C, a first copper etching process is performed, to etch the first copper diffusion barrier film layer 32, the copper/copper alloy film layer 33, and the second copper diffusion barrier film layer 34 which correspond to the photoresist completely-removed portion.

During the copper etching process, usually, an overetching time of 10% to 20% may be employed to ensure that the etching is complete. In addition, under the premise of ensuring that the copper is etched completely, the overetching time should be shortened as much as possible to reduce the chance of photoresist stripping and signal line breakage.

Figure 8D:
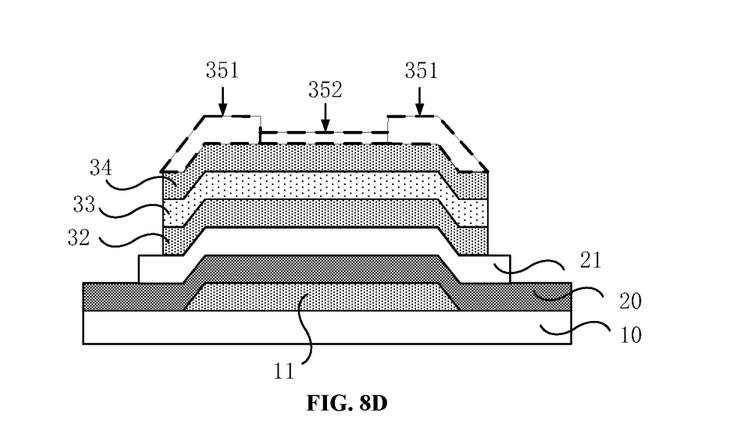

In a fourth operation, as shown in FIG. 8D, the oxide semiconductor film 31 is etched, and the oxide semiconductor film 31 corresponding to the photoresist completely-removed portion is etched to obtain an oxide active layer 21.

Figure 8E:
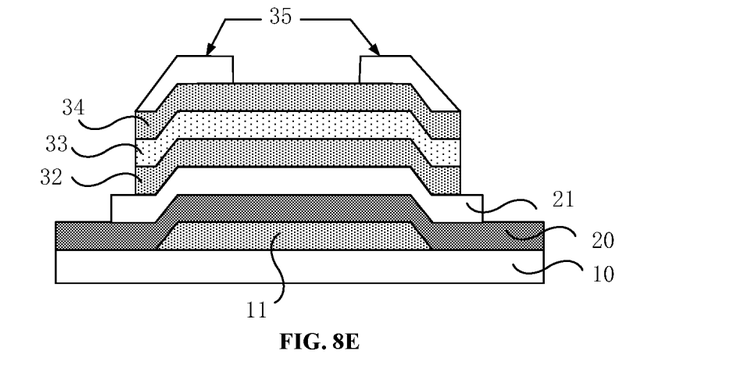

In a fifth operation, as shown in FIG. 8E, the photoresist half-retained portion 352 is removed by an ashing process.

Under the premise of ensuring that the photoresist half-retained portion 352 is grayed out completely, the ashing time should be shortened as much as possible to reduce the chance of photoresist stripping and signal line breakage.

Optionally, the photoresist 35 shown in FIG. 8E is dried. The drying temperature is 110°~150°, and the time is 100 s~200 s. In this way, the adhesion of the photoresist 35 on the surface of the second copper diffusion barrier layer 34 can be increased.

Figure 8F:
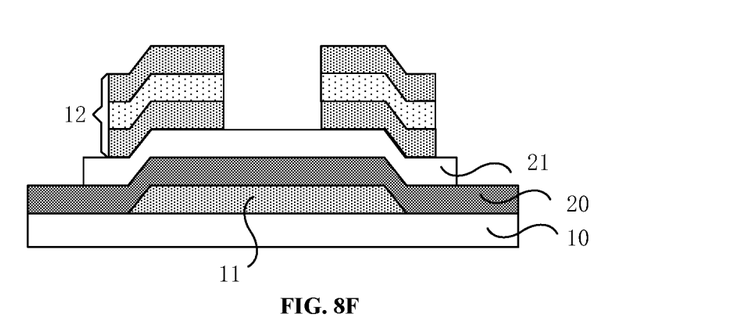

In a sixth operation S26, as shown in FIG. 8F, a second copper etching process is performed, to etch the exposed first copper diffusion barrier film layer 32, the copper/copper alloy film layer 33, and the second copper diffusion barrier film layer 34, to form the second conductive layer 12 described above.

During the copper etching process, usually, an overetching time of 10% to 20% may be employed to ensure that the etching is complete. In addition, under the premise of ensuring that the copper is etched completely, the overetching time should be shortened as much as possible to reduce the chance of photoresist stripping and signal line breakage.

Finally, the photoresist 35 is peeled off.

In addition, it will be apparent to those skilled in the art that other films and layers, such as a common electrode layer, a pixel electrode layer, may be further formed on the substrate 10 on which the second conductive layer 12 has been formed, which will not be elaborated in the present disclosure.

In addition, optionally, before S22, the manufacturing method further includes roughening the second conductive film. It should be noted that the specific manner of the above roughening treatment is not limited in the present disclosure, as long as the surface of the second conductive film is rough after the second conductive film is processed.

In this case, since the surface of the second conductive film is rough, when the photoresist 35 is formed on the second conductive film, the adhesion effect of the photoresist 35 on the second conductive film can be increased, thereby reducing the chance of generating a void in the photoresist 35 at the climbing area.

For example, the roughening treatment of the second conductive film may include: coating the surface of the second conductive film with a photoresist 35, pre-baking, exposing, developing, and post-baking the photoresist 35, and removing the photoresist 35. In this way, the surface of the second conductive film can be treated by the high temperature photoresist 35, so that the surface of the second conductive film can be rough.

In the present arrangement, the oxide active layer 21 and the second conductive layer 12 are formed by one patterning process, which can have the effect of simplifying the process, and can reduce the process cost.

However, the oxide active layer 21 may be formed by one patterning process first, and then the second conductive layer 12 is formed by another patterning process. In this case, an ordinary mask may be employed for the exposure process. By controlling the shape of the mask, the shape of the upper surface of the second signal line 121 in the second conductive layer 12 as formed can be controlled.

An arrangement of the present disclosure provides an array substrate. As shown in FIG. 3, the array substrate includes a substrate 10. A first signal line 111 and a second signal line 121 are sequentially disposed on the substrate 10. The first signal line 111 and the second signal line 121 are disposed intersecting each other and insulated from each other.

As shown in FIG. 4A, in the portion of the upper surface of the first signal line 111 which overlaps with the second signal line 121, a length of at least one edge E in the extending direction of the second signal line 121 is larger than a linear distance J between the two vertices of the edge E.

It should be noted that the first signal line 111 and the second signal line 121 are sequentially disposed on the substrate 10, so the second signal line 121 is located above the first signal line 111, and thus a climbing phenomenon may occur for the second signal line 121 at the overlapping area of the second signal line 121 and the first signal line 111.

Based on this, the above array substrate provided by the present disclosure includes a first signal line 111 and a second signal line 121 which are disposed intersecting each other and insulated from each other. In the portion of the upper surface of the first signal line 111 which overlaps with the second signal line 121, a length of at least one edge E in the extending direction of the second signal line 121 is larger than a linear distance J between the two vertices of the edge E. When the second signal line 121 is formed by a patterning process on the substrate 10 on which the first signal line 111 has been formed, assuming that the thickness of the first signal line 111 is constant, compared to the case where the edge E has a length equal to the linear distance between the two vertices of the edge E, the contact area of the second conductive film with the first conductive layer 11 at the climbing area will be increased when the second conductive layer 12 is formed by the patterning process. In this way, when photoresist is formed on the surface of the second conductive film, the photoresist can have an increased contact area with the second conductive film at the climbing area, which can reduce the chance of generating voids in the photoresist at the climbing area. In turn, during the etching process, it can reduce the chance of the etching liquid intruding into the second conductive film through the voids and causing the second signal line 121 to be broken.

On the basis of this, the present disclosure does not limit the shape of the edge E as long as the length of the edge E is larger than the linear distance J between the two vertices of the edge E. For example, the edge E may be as shown in FIG. 4A, the edge E may be an arc line; or the edge E may be a polygonal line.

On the basis of this, in order to increase the contact area of the photoresist 35 with the second conductive film at the climbing area when the second signal line 121 is formed by the patterning process, optionally, in the portion of the upper surface of the first signal line 111 which overlaps with the second signal line 121, two edges E in the extending direction of the second signal line 121 are all arc lines. In this case, as shown in FIG. 5A, the arc lines of the two edges E have the same protrusion direction. However, the arc lines of the two edges E may have different protrusion directions.

Further, in order to reduce the chance that the first signal line 111 is broken due to the narrow width of the portion of the upper surface of the first signal line 111 which overlaps with the second signal line 121, in the portion of the upper surface of the first signal line 111 which overlaps with the second signal line 121, the two edges E along the extending direction of the second signal line 121 may be arc lines having the same protrusion direction, or having protrusion directions pointing away from each other.

On this basis, in order to further increase the contact area of the photoresist 35 with the second conductive film at the climbing area, optionally, as shown in FIG. 5A, a width $W_2$ of the second signal line 121 in an overlapping region of orthogonal projections of the second signal line 121 and the first signal line 111 on the substrate 10 is larger than a width $W_1$ of the second signal line 121 in a non-overlapping region of the orthogonal projections of the second signal line 121 and the first signal line 111 on the substrate 10. The width of the second signal line 121 refers to a linear distance from one side of the second signal line 121 to the other side of the second signal line 121 along the extending direction of the first signal line 111 (i.e. the X direction shown in FIG. 3).

In this case, when the photoresist 35 is formed on the surface of the second conductive film, at the climbing area, compared to the case where $W_1=W_2$ in the second signal line 121, the photoresist 35 and the upper surface of the second conductive film can have a further increased contact area, so that the chance of generation of voids in the photoresist 35 at the climbing area can be further reduced.

Further, the first signal line 111 and the second signal line 121 described above are usually formed of copper/copper alloy. Since the property of copper is relatively active, in order to prevent the copper/copper alloy from being oxidized or diffused into the active layer or other films and layers and causing contamination to other films and layers, optionally, the first signal line 111 and the second signal line 121 include a first copper diffusion barrier layer, a copper/copper alloy layer, and a second copper diffusion barrier layer that are sequentially disposed.

In this way, the first copper diffusion barrier layer and the second copper diffusion barrier layer can prevent copper from diffusing into other films and layers, such as the active layer, and can also prevent the copper/copper alloy from being oxidized in the subsequent fabrication process of other films and layers.

Optionally, the material constituting the copper diffusion barrier layers includes a molybdenum-niobium alloy, a molybdenum-titanium alloy, an indium tin oxide, and an indium zinc oxide. The molybdenum-niobium alloy, the molybdenum-titanium alloy, the indium tin oxide, and the indium zinc oxide can well prevent the copper/copper alloy from diffusing and thus reduce the chance of being oxidized.

In addition, the present disclosure does not limit the type of the array substrate, and may be, for example, a bottom gate type array substrate or a top gate type array substrate. In the array substrate, a plurality of signal lines are disposed intersecting each other. When the array substrate is of a bottom gate type, as shown in FIG. 3, the first signal line 111 may be a gate line or a common line in the same layer as the gate line, and the second signal line 121 is a data line. When the array substrate is of the top gate type, the first signal line 111 is a data line, and the second signal line 121 is a gate line or a common line in the same layer as the gate line.

An arrangement of the present disclosure provides a display device, including any of the array substrates described above, which has the same structure and improvements as the array substrate provided by the foregoing arrangements. Since in the foregoing arrangements, the structure and improvements of the array substrate have been described in detail, the description thereof will not be repeated herein.

The above is only the specific arrangements of the present disclosure, but the scope of the present disclosure is not limited thereto, and modifications or substitutions easily conceived by any person skilled in the art within the technical scope of the present disclosure should be covered by the scope of the present disclosure. Therefore, the scope of the present disclosure should be determined by the scope of the appended claims.

What is claimed is:

1. A display panel, comprising: a first signal line comprising a first sub-portion and a second sub-portion; at least one insulating layer disposed on the first signal line; a second signal line comprising a third sub-portion and a fourth sub-portion and disposed on the insulating layer, wherein the second sub-portion and the fourth sub-portion have an overlapping part therebetween, the first sub-portion and the third sub-portion do not overlap each other, the second sub-portion has a varying line width, and at least one edge of the second sub-portion is extended away from a straight line connecting two vertices of the edge, so that a distance D between the straight line and a first point of the edge extending farthest from the straight line is in the range of 0.8% to 12% of a width of the second sub-portion.

2. The display panel according to claim 1, wherein the overlapping part between the second sub-portion and the fourth sub-portion is an overlap area of orthographic projections of the first signal line and the second signal line on the substrate.

3. The display panel according to claim 1, wherein the second sub-portion is extended in the form of an arc line or a polygonal line.

4. The display panel according to claim 1, wherein a width of the second sub-portion at the first point of the edge extending farthest from the straight line is greater than or less than an average width of the second sub-portion.

5. The display panel according to claim 1, wherein a width of the second sub-portion is substantially uniform.

6. The display panel according to claim 1, wherein a maximum width or a minimum width of the second sub-portion is not equal to a width of the first sub-portion, and a difference $\Delta d1$ between the maximum width or minimum width of the second sub-portion and the width of the first sub-portion satisfies: $0\ \mu m<|\Delta d1|\leq 3.5\ \mu m$.

7. The display panel according to claim 1, wherein a width of the third sub-portion is not equal to a width of the fourth sub-portion, and a difference $\Delta d2$ between the width of the third sub-portion and the width of the fourth sub-portion satisfies: 0 μm<|Δd1|≤1.5 μm.

8. The display panel according to claim 1, wherein the second signal line comprises a metal layer and at least one metal protection layer, and wherein the metal protection layer is disposed on a side of the metal layer facing the insulating layer.

9. The display panel according to claim 8, wherein a metal contact angle of the metal protection layer is 43°~85°.

10. The display panel according to claim 1, wherein:
the first signal line is a gate line or a common line, and the second signal line is a data line; or
the first signal line is the data line, and the second signal line is the gate line or the common line.

11. A display device comprising a display panel, wherein the display panel comprises: a first signal line comprising a first sub-portion and a second sub-portion; at least one insulating layer disposed on the first signal line; a second signal line comprising a third sub-portion and a fourth sub-portion and disposed on the insulating layer, wherein the second sub-portion and the fourth sub-portion have an overlapping part therebetween, the first sub-portion and the third sub-portion do not overlap each other, the second sub-portion has a varying line width, and at least one edge of the second sub-portion is extended away from a straight line connecting two vertices of the edge, so that a distance D between the straight line and a first point of the edge extending farthest from the straight line is in the range of 0.8% to 12% of a width of the second sub-portion.

12. The display panel according to claim 11, wherein the overlapping part between the second sub-portion and the fourth sub-portion is an overlap area of orthographic projections of the first signal line and the second signal line on the substrate.

13. The display device according to claim 11, wherein the second sub-portion is extended in the form of an arc line or a polygonal line.

14. The display device according to claim 11, wherein a width of the second sub-portion at the first point of the edge extending farthest from the straight line is greater than or less than an average width of the second sub-portion.

15. The display device according to claim 11, wherein a width of the second sub-portion is substantially uniform.

16. The display device according to claim 11, wherein a maximum width or a minimum width of the second sub-portion is not equal to a width of the first sub-portion, and a difference Δd1 between the maximum width or minimum width of the second sub-portion and the width of the first sub-portion satisfies: 0 μm<|Δd1|≤3.5 μm.

17. The display device according to claim 11, wherein a width of the third sub-portion is not equal to a width of the fourth sub-portion, and a difference Δd2 between the width of the third sub-portion and the width of the fourth sub-portion satisfies: 0 μm<|Δd1|≤1.5 μm.

18. The display device according to claim 11, wherein the second signal line comprises a metal layer and at least one metal protection layer, and wherein the metal protection layer is disposed on a side of the metal layer facing the insulating layer.

19. The display device according to claim 18, wherein a metal contact angle of the metal protection layer is 43°~85°.

20. The display device according to claim 11, wherein:
the first signal line is a gate line or a common line, and the second signal line is a data line; or
the first signal line is the data line, and the second signal line is the gate line or the common line.

* * * * *